United States Patent [19]

Hovens

[11] Patent Number: 5,008,659
[45] Date of Patent: Apr. 16, 1991

[54] PICTURE DISPLAY DEVICE INCLUDING A WAVEFORM GENERATOR/AND A COMPENSATION CIRCUIT, AND INTEGRATED CIRCUIT INCORPORATING THE SAME

[75] Inventor: Paulus J. M. Hovens, Eindhoven, Netherlands

[73] Assignee: U.S. Philips Corporation, New York, N.Y.

[21] Appl. No.: 301,574

[22] Filed: Jan. 24, 1989

[30] Foreign Application Priority Data

Feb. 8, 1988 [NL] Netherlands .................. 8800286

[51] Int. Cl.$^5$ .................................. G09G 3/00
[52] U.S. Cl. ............................ 340/812; 340/813; 358/158; 358/159
[58] Field of Search .............. 340/812, 813, 814; 358/158, 159; 315/370, 371

[56] References Cited

U.S. PATENT DOCUMENTS

| | | | |
|---|---|---|---|
| 4,672,449 | 6/1987 | Kraus et al. | 340/814 |
| 4,713,690 | 12/1987 | Watanabe et al. | 340/814 |
| 4,733,197 | 3/1988 | Chow | 358/158 |
| 4,748,505 | 5/1988 | Smeulers et al. | 358/159 |
| 4,791,488 | 12/1988 | Fukazawa et al. | 358/158 |
| 4,871,951 | 10/1989 | Teuling | 358/158 |
| 4,872,055 | 10/1989 | Teuling et al. | 340/814 |

*Primary Examiner*—Alvin E. Oberley
*Assistant Examiner*—M. Fatahiyar
*Attorney, Agent, or Firm*—Edward W. Goodman

[57] ABSTRACT

A picture display device including a generator circuit for generating a periodical waveform for addressing picture elements on a picture display screen, this generator circuit including a time-determining network with a capacitor. To reduce the influence of tolerances, the picture display device is provided with a compensation circuit including a second generator for generating a second periodical waveform and a source for applying a compensation current to the first-mentioned capacitor in dependence upon the second waveform, the second waveform generator including a time-determining network with a second capacitor and both capacitors being integrated in one semiconductor body.

8 Claims, 1 Drawing Sheet

PICTURE DISPLAY DEVICE INCLUDING A WAVEFORM GENERATOR/AND A COMPENSATION CIRCUIT, AND INTEGRATED CIRCUIT INCORPORATING THE SAME

BACKGROUND OF THE INVENTION

1. Field of the Invention

The invention relates to a picture display device including a generator circuit for generating a periodical waveform for addressing picture elements on a picture display screen, said circuit comprising a time-determining network including a capacitor.

Recently, advanced techniques have made it possible to integrate time-determining RC networks in a semiconductor body. This integration requires very strict tolerances of the order of 1 to 2% in order to preclude adjustments. However, when integrating these networks, the tolerance is of the order of 5 to 10% for the capacitors and 10 to 15% for the resistors, and moreover, the resistors have a noticeable temperature coefficient.

2. Description of the Related Art

A circuit in a picture display device for generating periodical waveforms for addressing picture elements on a picture display screen, for example, the deflection in a picture display tube, comprises inter alia generators, for example, sawtooth generators or controllable oscillators which are synchronized with line and field frequency signals, respectively, present in an incoming video signal. The integrated circuit of the Philips type TDA 8370 is an example of such a circuit. If the time-determining elements of the generators are also to be integrated in the same semiconductor body comprising the greater part of the circuit, the tolerances may lead to inadmissible variations in the nominal frequency and in the nominal amplitude of the waveforms generated by the generators.

SUMMARY OF THE INVENTION

It is an object of the invention to provide a circuit of the type described above in which the capacitor of the waveform generator can be integrated and in which the waveform obtained thereby is not very much dependent on processes, so that the waveforms generated by various integrated circuits of the same type are substantially the same without adjustments being required. To this end, the circuit according to the invention is characterized in that the picture display device is provided with a compensation circuit including a second generator for generating a second periodical waveform and a source for applying a compensation current to the first-mentioned capacitor in dependence upon the second waveform, the second waveform generator comprising a time-determining network with a second capacitor and the two capacitors being integrated in one semiconductor body.

Since the two generators are incorporated in the same semiconductor body, the tolerances of the corresponding elements in the generators are substantially identical. Therefore, a substantially correct compensation can be obtained by means of a suitable design, while the spread in the properties of the first-mentioned generator is not dependent on the capacitance of the first capacitor but on the ratio between the capacitances of the two capacitors, which ratio has a much stricter tolerance than the capacitances.

The compensation circuit may advantageously include a rectifier circuit for determining the peak value of the second waveform, said compensation current source being coupled to said rectifier circuit. In this way the dependence between the compensation current and the second waveform is realized in a simple manner.

The compensation may even be better if, according to a further aspect of the invention, the second waveform generator is a shaper for reshaping a clock signal generated by a clock signal generator. Such a clock signal is usually very stable so that the signal generated by means of the second waveform generator and hence derived from the clock signal is accurately determined with respect to time.

An existing generator may advantageously be utilized as a clock signal generator, for example, a generator forming part of a control loop for generating a local line signal synchronized with an incoming line-synchronizing signal.

A further compensation for temperature effects is obtained in that the picture display device according to the invention is further characterized in that the time-determining network of the first waveform generator includes a first resistor and the time-determining network of the second waveform generator includes a second resistor, both resistors being also integrated in the semiconductor body.

The invention relates also to an integrated circuit in the form of a semiconductor body for use in a picture display device as described above, this integrated circuit being characterized in that the circuit elements mentioned therein and being part of the generator circuit and of the compensation circuits are incorporated in the semiconductor body.

BRIEF DESCRIPTION OF THE DRAWING

The invention will now be described in greater detail, by way of example, with reference to the accompanying drawing, in which.

DESCRIPTION OF THE PREFERRED EMBODIMENT

Figure 1:
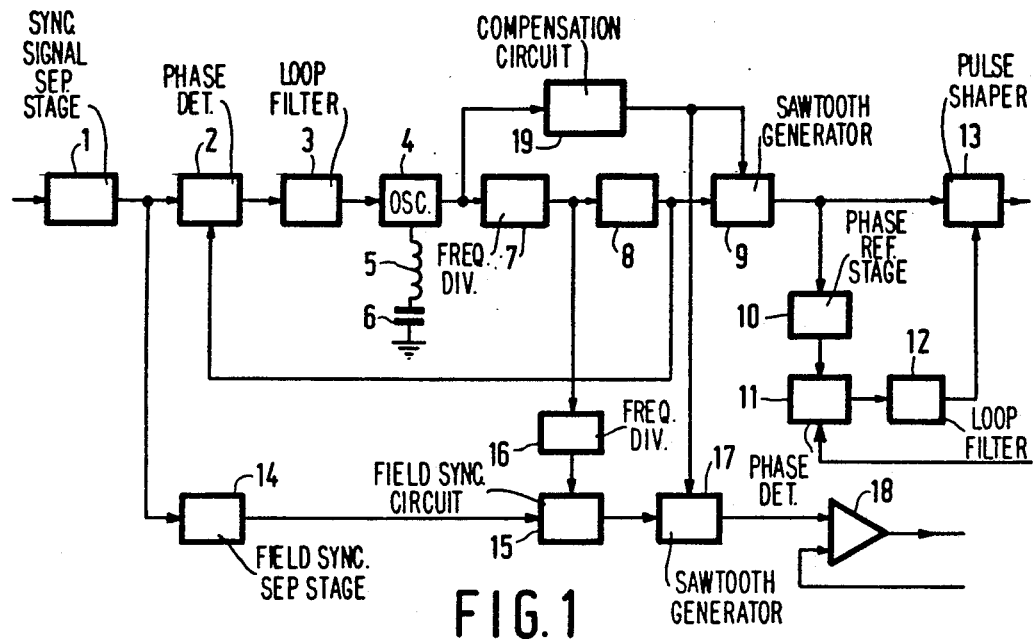
FIG. 1 is a block diagram of a part of a picture display device including a compensation circuit according to the invention.

FIG. 1 shows the most important parts of the synchronizing circuit of a picture display device, for example, a television receiver. The reference numeral 1 denotes a synchronizing signal separator stage receiving an incoming video signal. The synchronizing signal obtained by means of stage 1 and a locally generated line signal are applied to a first phase detector 2. Detector 2 generates a control signal which depends on the phase difference between the two input signals and which is smoothed by a first loop filter 3. The smoothed signal is applied to a control input of a controllable oscillator 4 for controlling the frequency and/or the phase of the signal generated by the oscillator. Oscillator 4 is a sine-oscillator including a series-resonant network as a frequency-determining element which comprises an inductance 5 of approximately 7 $\mu$H and a capacitor 6 of approximately 100 pF and which is connected outside the integrated circuit comprising the majority of elements of FIG. 1. The signal of oscillator 4 nominally has a frequency of 6 MHz and is used as a clock signal for several parts, for example, the teletext section of the receiver. The frequency of the clock signal is divided by 192 by means of a first-frequency divider circuit 7 so that in the nominal state of the synchronizing circuit a signal is obtained at a frequency of 31.25 kHz, i.e. twice the repetition frequency of the line-synchronizing signal which is present in the incoming video signal (European television standard). A second frequency divider circuit 8 divides by 2 so that the local signal applied to phase detector 2 is obtained. It is apparent from the foregoing that elements 2 to 8 constitute a line-phase control loop for generating a local line signal having the same frequency and substantially the same phase as the incoming line-synchronizing signal.

This local signal is applied as a trigger signal to a generator 9 which generates a sawtooth-shaped signal and applies this signal to a phase-reference stage 10. Stage 10 defines a given phase position of a local signal and this phase position is compared in a second phase detector 11 with that of a retrace pulse, i.e. a pulse which is present in a line output stage not shown. The control signal generated by detector 11 is smoothed by a second loop filter 12 and the smoothed signal, which is a DC signal, is applied to a pulse shaper 13 which also receives the sawtooth-shaped signal from generator 9. Pulse shaper 13 supplies a pulsatory signal to a driver stage (not shown), this signal having a phase which is controlled by the signal of filter 12. The signal amplified by the driver stage is applied to the line output stage for the horizontal deflection in a picture display tube not shown. It is apparent from the foregoing that elements 9 to 13 form part of a phase control loop in order to achieve that the line retrace pulses and thus the line deflection have a phase position with respect to the incoming line-synchronizing signal, which position is substantially independent of delays produced in the driver stage and in the output stage.

The synchronizing signal available at the output of stage 1 is also applied to a field-synchronizing signal separator stage 14 and the field-synchronizing signal obtained by means of this stage is applied to a field-synchronizing circuit 15. The signal of the double line frequency obtained by means of circuit 7 is also applied to a third frequency divider circuit 16 which divides by 625. In the nominal state of the line control loop, the signal obtained by this division has the field frequency of 50 Hz. A signal having the same frequency and substantially the same phase as the incoming field-synchronizing signal is available at an output of circuit 15 and is applied as a trigger signal to a sawtooth generator 17. The signal of generator 17 is applied to an input of an amplifier 18 which applies a signal to a field output stage (not shown) for the vertical deflection in the picture display tube. A feedback signal originating from the output stage is applied to another input of amplifier 18 for obtaining a substantially linear amplification of the sawtooth-shaped signal.

The synchronizing circuit described is well known to those skilled in the art and does not need any further explanation. Most of its parts are incorporated in an integrated circuit, for example, the synchronizing signal processing circuit of the Philips type TDA 8370. If the time-determining networks are also to be integrated in such a circuit, in which no controls are necessary for eliminating differences between specimens of the circuit, the above-mentioned drawbacks occur due to too ample tolerances of the integrated components and too high temperature coefficients of the integrated resistors. This particularly applies to the sawtooth generators 9 and 17. Each of these generators includes a capacitor which is charged by a current source and is subsequently discharged under the influence of the applied trigger signal. The value at a given instant of the generated sawtooth-shaped voltage is inversely proportional to the capacitance of the capacitor. A variation of the capacitance thus causes a variation of the amplitude of the sawtooth. It appears therefrom that the instants of occurrence of the edges of the pulses applied to the line driver, on the one hand, and the amplitude of the current flowing through the field deflection coil, on the other hand, may be different for each specimen of the circuit. According to the invention this error is considerably reduced because a compensation circuit 19 is incorporated in the same semiconductor body. An input of circuit 19 is connected to oscillator 4, a first output is connected to generator 9 and a second output is connected to generator 17.

Figure 2:
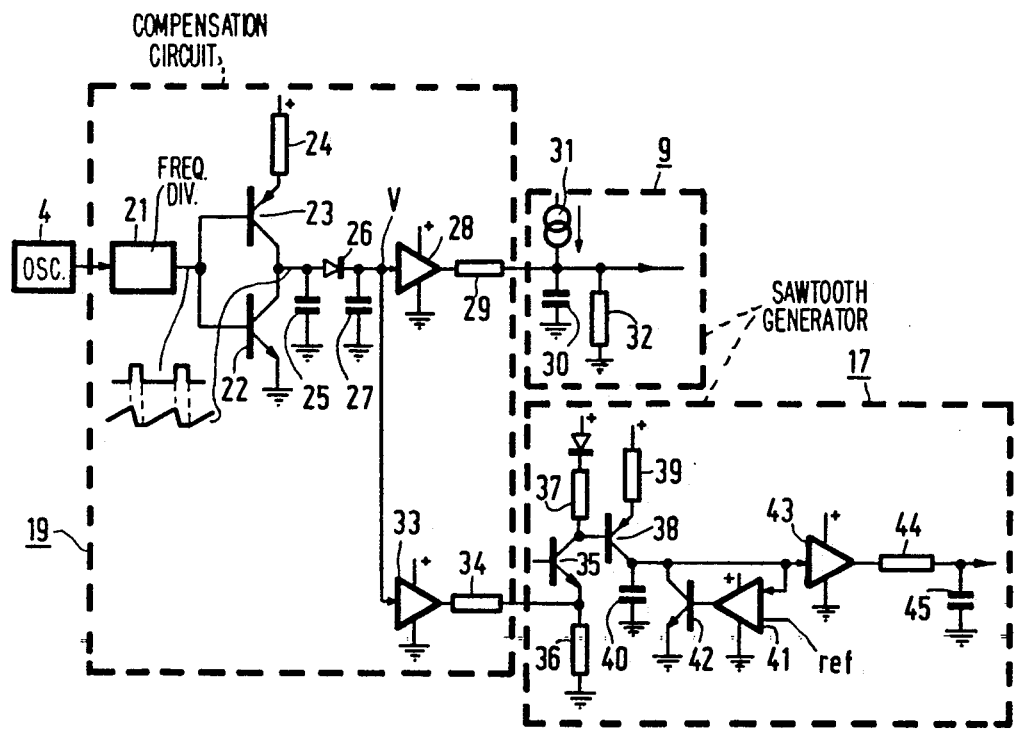
FIG. 2 is a more detailed basic circuit diagram of the compensation circuit of FIG. 1.

Circuit 19 is shown in greater detail in FIG. 2. In this circuit a frequency divider circuit 21 receives the signal from oscillator 4. An output of circuit 21 conveys a square-wave signal whose frequency is, for example, 10 times as low as the frequency of the signal of the oscillator and this signal is applied to the base of a switching transistor 22 of the npn type and to the base of a pnp transistor 23. The emitter of transistor 22 is connected to ground and the emitter of transistor 23 is connected to a positive power supply voltage via a resistor 24. Both collectors are interconnected and connected to a capacitor 25 of, for example, 100 pF, the other terminal of which is connected to ground.

In the time interval in which the control signal at the interconnected bases has its low level, transistor 23 is turned on, whereas transistor 22 is turned off. The collector current of transistor 23 is constant and charges capacitor 25. The control signal subsequently has a high level so that transistor 22 is turned on whereas transistor 23 is turned off. Capacitor 25 is discharged rapidly. The variation as a function of time of the voltage across the capacitor is illustrated in FIG. 2. The ratio in the control signal between the period of conductance of transistor 22 and the period of the signal (the duty cycle), for example 0.3, is not very critical. The only requirement which is imposed is that the discharge time should be long enough for capacitor 25 to be discharged completely. Elements 22 to 25 convert the square-wave signal of circuit 21 into a sawtooth-shaped voltage which is present across capacitor 25. This voltage is rectified by means of a diode 26 followed by a capacitor 27 and a buffer amplifier 28. Elements 26, 27 and 28 constitute a substantially ideal peak detector and the direct voltage obtained thereby is not dependent on the capacitance of capacitor 27.

A resistor 29 is connected to an output of amplifier 28 and the other terminal of this resistor is connected to generator 9. This generator includes a capacitor 30 and a constant charge current source 31 connected in series therewith. FIG. 2 shows a resistor 32 which is arranged parallel to capacitor 30, that is to say, between ground and the junction point of source 31 and the capacitor, which resistor represents the resistance which is present between the junction point and ground when the capacitor is being charged. Resistor 29 is connected to the junction point and has a value which is high, for example, 10 times as high as the value of resistor 32. The current source constituted by resistor 29 may thus be considered as a source having a high internal resistance, the current of this source not being influenced by the values of elements 30 and 32. Other elements (not shown) are coupled to the junction point for controlling the charging and discharging of the voltage across capacitor 30 in known manner and thus for influencing the frequency of the sawtooth-shaped voltage obtained. The natural frequency of generator 9, that is to say, in operation in the absence of a trigger signal, is determined, for example, in that the charging of the capacitor 30 is terminated, which initiates the discharging, at the instant when the sawtooth-shaped voltage reaches a predetermined level.

The slope and hence the amplitude of the above-mentioned voltage depend on the values of resistors 29 and 32 and on the capacitance of capacitor 30 as well as on the variation of the values of these resistors as a function of temperature. If these components have the nominal values, i.e. the values stated by the manufacturer of the circuit, the nominal amplitude is reached at the instant when the trigger signal occurs. However, if the capacitance of capacitor 30 is, for example, larger than its nominal value, the voltage generated by means of this capacitor is lower than the nominal value of this voltage in the absence of circuit 19. As a result, an edge generated by pulse shaper 13 has not the correct location with respect to time. In fact, this location depends on the voltage across capacitor 30 and on the level of the control signal of filter 12.

The sawtooth-shaped voltage present across capacitor 25 and hence the voltage V across capacitor 27 depend, however, on the value of resistor 24 and on the capacitance of capacitor 25 in a similar way and with a similar temperature dependence as the voltage across capacitor 30. Since generator 9 and circuit 19 are incorporated in the same semiconductor body, the tolerances and the temperature coefficients of the elements of the sawtooth generator 9 and of the elements 22 to 25 of the second sawtooth generator are substantially identical. In the given example, voltage V is thus also too low. Amplifier 28 inverts the variation at its input so that the output current of the amplifier flowing through resistor 29 and being a charge current for capacitor 30 has a higher value than would be the case in the nominal state. When correctly dimensioning the several components of the circuit of FIG. 2 such a compensation is obtained in this manner that the amplitude of the voltage across capacitor 30 substantially has the nominal value. It will be obvious that a substantially correct compensation will also be obtained in other cases in which a deviation occurs with respect to the nominal state.

Since the relevant components are incorporated in one and the same semiconductor body, the influence of tolerances and temperature coefficients is very small thanks to the use of the compensation circuit 19 described. In fact, the spread in the properties of generator 9 now depends on the ratios between the values of resistors 24 and 32 and to a lesser extent on the ratio between the values of resistors 29 and 32 as well as on the ratio between the capacitances of capacitors 25 and 30, which ratios have much stricter tolerances than the values of the elements themselves. This is possible because the signal which is used for the sawtooth-shaped voltage in the compensation circuit 19 is derived from the signal of oscillator 4, i.e. an oscillator which is very stable and accurate, so that the edges of the oscillator signal and hence the voltage across capacitor 25 are very accurately determined with respect to time. The frequency of the sawtooth-shaped signal across capacitor 25 is not very important in this case.

In view of the low field frequency, for example, 50 Hz for the European television standard, generator 17 cannot have a similar structure as generator 9 but in this embodiment it has the form of a sampled oscillator. An npn transistor 35 has an emitter resistor 36 and a collector resistor 37 and is controlled at its base by positively directed sampling pulses. The pulses which are present at the collector of transistor 35 and which are negatively directed are applied to the base of a pnp transistor 38 whose emitter is connected to the power supply voltage via a resistor 39 and whose collector is connected to ground via a capacitor 40. Whenever a sampling pulse occurs, capacitor 40 is each time charged to a higher level so that the voltage across the capacitor is staircase-shaped. The sampling pulses occur, for example, during one half of the clock signal generated by oscillator 4 and thus have a duration of 83.3 ns. Per line period, 12 pulses occur, i.e. $12 \times 312.5 = 3750$ pulses per field period. If the charge current has a value 1.6 $\mu$A per pulse and if capacitor 40 has a capacitance of 100 pF, it appears that the voltage across the capacitor increases by 1.33 mV per pulse and thus by 5 V per field. This voltage is compared with a reference voltage of 5 V by means of a level detector 41. At the instant when the voltage reaches the reference value, a signal at an output of detector 41 turns on an npn transistor 42 whose base is connected to this output. The collector-emitter path of transistor 42 constitutes a short circuit for capacitor 40 which is thereby discharged. The voltage across capacitor 40 is applied via a buffer 43 to a low-pass filter consisting of a resistor 44 of, for example, 100 kQ and a capacitor 45 of, for example, 25 pF for the purpose of removing the high-frequency components. The field frequency sawtooth-shaped voltage is present across capacitor 45 and is applied to amplifier 18. Circuit 19 includes a second buffer amplifier 33 having an input which is connected to voltage V and an output of amplifier 33 is connected via a resistor 34 to the emitter of transistor 35, the value of resistor 34 being many times higher than that of the resistance present at this emitter. Similarly as with generator 9, a compensation for the errors caused by tolerances and temperature coefficients is obtained by means of generator 17.

A compensation circuit for triggerable sawtooth generators has been described hereinbefore. It will be evident that a similar measure can be used for generators of a different type each including a capacitor. For example, generator 9 may be a continuously controllable line oscillator including a capacitor as a frequency-dependent element, for example, a capacitor whose capacitance can be influenced by a control voltage. In this case, the waveform generator of the compensation circuit may advantageously be in the form of a similar oscillator, i.e. a generator generating a signal which has the same shape but may have a different frequency. It will also be evident that the signal for the generator need not necessarily be derived from oscillator 4, but from any stable clock generator which is available in the picture display device.

What is claimed is:

1. A picture display device including a first generator circuit for generating a first periodical waveform for addressing picture elements on a picture display screen, said circuit comprising a first time-determining network including a first capacitor, characterized in that the picture display device is provided with a compensation circuit for compensating for inaccuracies in the values of components in said first generator circuit, said compensation circuit including a second generator circuit for generating a second periodical waveform and a source for applying a compensation current to the first capacitor in dependence upon the second periodical waveform, the second generator circuit comprising a second time-determining network with a second capacitor, and the first and second capacitors being integrated in one semiconductor body.

2. A picture display device as claimed in claim 1, characterized in that the compensation circuit includes a rectifier circuit for determining the peak value of the second periodical waveform, said compensation current source being coupled to an output of said rectifier circuit.

3. A picture display device as claimed in claim 1, characterized in that the second generator circuit is a shaper for reshaping a clock signal generated by a clock signal generator.

4. A picture display device as claimed in claim 3, characterized in that the second periodical waveform has the same shape as the first periodical waveform.

5. A picture display device as claimed in claim 3, characterized in that the second generator circuit generates a sawtooth-shaped voltage across the second capacitor.

6. A picture display device as claimed in claim 3, characterized in that the clock signal generator forms part of a control loop for generating a local line signal synchronized with an incoming line-synchronizing signal.

7. A picture display device as claimed in claim 1, characterized in that the first time-determining network of the first generator circuit includes a first resistor and the second time-determining network of the second generator circuit includes a second resistor, said first and second resistors being also integrated in the semiconductor body.

8. An integrated circuit in the form of a semiconductor body for use in a picture display device as claimed in any of the preceding claims, characterized in that the circuit elements mentioned therein and being part of the generator circuit and of the compensation circuit are incorporated in the semiconductor body.

* * * * *